(12) United States Patent
Maquin et al.

(10) Patent No.: US 7,998,426 B2
(45) Date of Patent: Aug. 16, 2011

(54) PLASMA-BASED GAS TREATMENT SYSTEM INTEGRATED IN A VACUUM PUMP

(75) Inventors: Philippe Maquin, St Jean de Sixt (FR); Thierry Neel, Meythet (FR); Roland Bernard, Viuz-la-Chiesaz (FR)

(73) Assignee: Alcatel, Paris (FR)

( * ) Notice: Subject to any disclaimer, the term of this patent is extended or adjusted under 35 U.S.C. 154(b) by 1844 days.

(21) Appl. No.: 10/998,915

(22) Filed: Nov. 30, 2004

(65) Prior Publication Data
US 2005/0142000 A1    Jun. 30, 2005

(30) Foreign Application Priority Data

Dec. 1, 2003 (FR) ...................................... 03 14176

(51) Int. Cl.
*B01J 19/08* (2006.01)
*B01J 19/12* (2006.01)
(52) U.S. Cl. .............. 422/186; 422/186.03; 422/186.04; 422/900; 422/906; 417/244
(58) Field of Classification Search .................. 422/186, 422/186.03, 186.04, 900, 906; 417/244
See application file for complete search history.

(56) References Cited

U.S. PATENT DOCUMENTS

| 5,672,322 | A | 9/1997 | Visser |
| 6,621,227 | B1 | 9/2003 | Aoyagi |
| 2002/0033377 | A1 | 3/2002 | Namose |
| 2003/0007910 | A1* | 1/2003 | Lazarovich et al. ..... 422/186.18 |
| 2003/0077182 | A1* | 4/2003 | Naito et al. ................... 417/244 |

FOREIGN PATENT DOCUMENTS

| EP | 0 781 599 A | 7/1997 |
| FR | 2 925 205 A | 12/2002 |
| JP | 2001 314752 A | 11/2001 |

OTHER PUBLICATIONS

Patent Abstracts of Japan, vol. 2002, No. 03, Apr. 3, 2002 corresponding to JP 2001 314752 A (Hokushin Ind, Inc.—Honda Motor Co. Ltd).
US 5,131,925, 07/1992, Bachmann (withdrawn)

* cited by examiner

*Primary Examiner* — Walter D Griffin
*Assistant Examiner* — Lessanework Seifu
(74) *Attorney, Agent, or Firm* — Sughrue Mion, PLLC

(57) ABSTRACT

A pumping system comprising at least one pump unit (2) with a vacuum pump casing in which there are multiple pumping stages that includes at least one pumped gas treatment system is provided. The pumped gas treatment system compromises at least one plasma source located inside the vacuum pump casing of the pump unit, to generate a plasma that at least partially decomposes certain gases passing through the pump unit. This reduces the size of the pumped gas treatment system and improves its efficiency so that a gas pumping and treatment system can be created that is sufficiently small as to allow it to be placed in close proximity to the process chambers.

10 Claims, 2 Drawing Sheets

PLASMA-BASED GAS TREATMENT SYSTEM INTEGRATED IN A VACUUM PUMP

The present invention concerns the treatment of gases extracted from vacuum chambers such as the process chambers used for the production of semi-conductors.

BACKGROUND OF THE INVENTION

The process gases used in the semi-conductor industry are usually toxic, corrosive, or even damaging to the ozone layer, or generate a strong greenhouse effect. The gases extracted must therefore be treated before any are expelled into the atmosphere, so that only relatively harmless gases are released.

Until now, process gases have mainly been treated in gas treatment assemblies at pumping system discharges. Consequently, such gas treatment assemblies must be designed and dimensioned to treat the entire pumping system outflow.

A first disadvantage of known gas assemblies units is their large size, which is necessary to treat the large outflow quantity. These gas treatment assemblies are therefore located elsewhere, in other words placed on a lower floor of semi-conductor production plants and connected to the process chamber via long and costly lines. The size of these gas treatment assemblies makes it impossible to install them near process chambers.

A second disadvantage is that the pumping system outflow contains not only the gases extracted from the process chambers, but also the purge gases that are introduced into the vacuum chain, between the process chamber outlet and the pumping system discharge. These purge gases, which are added to protect the pumping systems, disrupt the effectiveness of the gas treatment process and add further complications, leading to an additional increase in the size of gas treatment assemblies.

More recently, document U.S. Pat. No. 5,672,322 proposed a gas treatment system external to the pump that is not connected to the pump's discharge, but between two of the pump's successive stages, using bypass lines.

The gas treatment may in this way be improved as the harmful gases may be treated before their dilution by the purge gases in the pump's successive stages.

However, these bypass gas treatment systems between successive stages of the pump, which are only partially integrated with the pump, again present significant disadvantages, which are explained below.

In particular, with such a bypass gas treatment between successive stages of the pump, the operating of the pump itself is apparently degraded, as a reduction is observed in pumping capacity, pumping speed and vacuum performance. The pumping system is thus disrupted by the presence of the gas treatment system and more effective gas treatment is provided to the detriment of pump efficiency.

SUMMARY OF THE INVENTION

The problem tackled by the present invention is the designing of a new plasma-based gas treatment system structure that offers more effective gas treatment, but also maintains the pumping system's properties, particularly with regard to pumping capacities, pumping speed and vacuum performances, as well as very noticeably reducing the size of gas treatment devices to allow their integration as close as possible to process chambers.

The invention is therefore the result of an analysis of the disadvantages of known systems, in particular of the system described in document U.S. Pat. No. 5,672,322.

It appears that the reduction in the pumping system's performances is a consequence of the very fact that the gas treatment system is placed outside the pumping system and is connected to it via bypass lines. The gas treatment system and the bypass lines are an imposed port area that the pumped gases must pass through and that tends therefore to oppose the free passage of the pumped gases between two successive stages of a pump. This resistance explains the fall in the pumping system's performance, and this fall in performance is all the more noticeable if the bypass lines and the gas treatment system have a small cross-section.

The increasing of the bypass lines' and the gas treatment system's cross-section could be considered, but this large air space would make certain plasma-based gas treatments more difficult, as a high power plasma source would be required, leading to high energy consumption and the adaptation of generating devices that would occupy considerable additional space themselves.

The basic idea of the invention is therefore to at least partially treat the gases as they pass between two successive stages of the pumping system's vacuum pump by placing the plasma source that decomposes the noxious gases inside the vacuum pump.

The invention therefore proposes a gas pumping and treatment system comprising at least one pump unit with a vacuum pump casing in which there are multiple pumping stages and comprising at least one pumped gas treatment system, in which the pumped gas treatment system includes at least one plasma source, located inside the pump unit's vacuum pump casing, to generate a plasma that at least partially decomposes certain gases passing through the pump unit.

According to a first variant, the plasma source is located in a stage inside the pump unit's vacuum pump casing.

The stage containing the plasma source is preferably a low pressure stage.

According to a second variant, the plasma source is located in an inter-stage line inside the pump unit's vacuum pump casing.

The inter-stage line preferably connects two pump unit low pressure stages. In this way the noxious gases are acted on even before their dilution in the purge or treatment gases.

It would be advantageous to have a gas pumping and treatment system comprising several plasma sources respectively inserted in pump unit stages, in particular low pressure stages, and/or in several successive inter-stage lines between stages, low pressure first stages in particular.

The plasma-based treatment of gases in a pump unit's inter-stage lines may be improved by combining the decomposition of the gases through the plasma with the injecting of neutralization gases, which prevents the recomposition of the gases decomposed by the plasma, and recomposes them following a controlled chemical reaction into less noxious by-products. According to the invention, advantage can then be taken of the presence of a purge circuit by using a suitable neutralization gas source to inject the neutralization gas into the purge circuit itself, which introduces it into the pump unit.

Another advantage of the invention is therefore that it reduces the quantity of noxious gases present in the pump unit and it consequently also reduces the quantity of neutralization gas that needs to be introduced into the pump unit to neutralize the remaining quantity of noxious gases.

A beneficial approach is to have control devices that adjust the pump unit's rotation speed to optimize internal pressures and the respective plasma parameters in the inter-stage line and/or the stage, in order to increase the plasma-induced gas species conversion yield.

Alternatively, or in addition, control devices may adjust the plasma generation power delivered by the plasma source according to the pumping speed, in order to increase the plasma-induced gas species conversion yield.

In addition, at least one optical spectrometry plasma measuring device may be associated with at least one plasma source, to measure, monitor and optimize the gas reactions in the inter-stage line and/or the stage, acting on the pump unit's speed, and/or on the power of the plasma source, and/or on the quantity of neutralization gas injected by the neutralization gas source into the purge circuit.

The invention should apply to all types of multiple stage pump units with inter-stage lines, in particular to multistage roots type pump units, for example an "Alcatel Dry Pump A300" pump produced and distributed by the company ALCATEL.

Other objectives, characteristics and benefits of the present invention will emerge from the following description of particular approaches taken in connection with the figures appended illustrating a pumping system equipped with a gas treatment device according to the invention.

DETAILED DESCRIPTION OF EXEMPLARY EMBODIMENTS OF THE INVENTION

Figure 1:
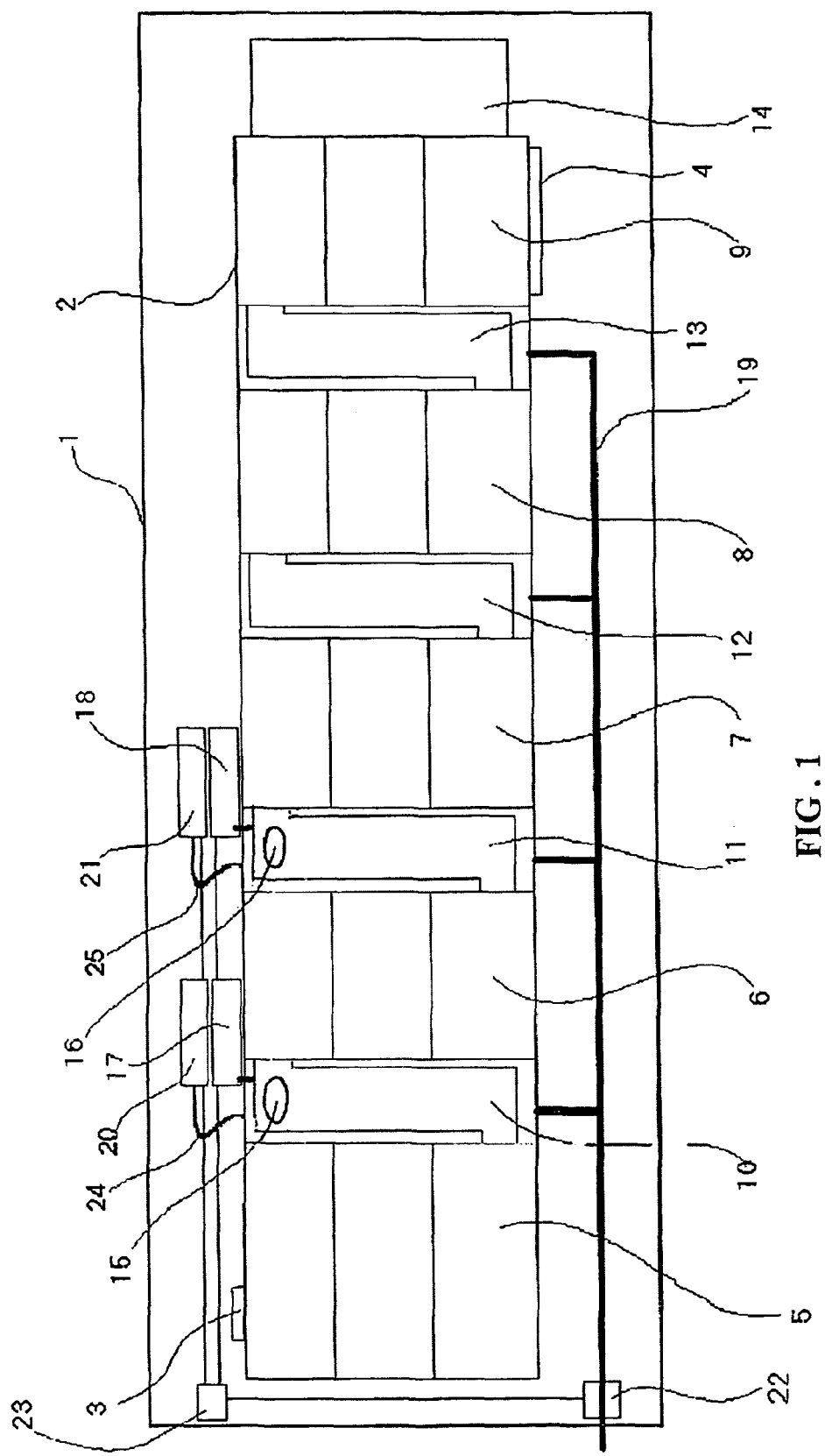
FIG. 1 shows a pumping system equipped with a gas treatment device according to the invention in which the plasma sources are located in the inter-stage lines.

The pumping system shown in the figure includes, in a housing 1, a pump unit 2 with a vacuum pump casing in which there are multiple pumping stages such as stages 5, 6, 7, 8 and 9 between a pump inlet 3 and a pump outlet 4.

The pumping stages are connected in the direction of the gas flow in series, one after the other, through the respective inter-stage lines 10, 11, 12 and 13 inside the pump unit casing 2.

Pumping stages 5 to 9 each have a stator and a rotor. The rotors, according to a known principle, are coupled mechanically on the same shaft rotated by a variable or fixed speed motor 14.

The inter-stage lines 10 and 11 that link the lower pressure pump unit stages 5 and 6 or 6 and 7 respectively, contain two respective plasma sources 15 and 16 suitable for generating, in the low pressure pumped gases contained in the inter-stage lines 10 and 11, a plasma capable of decomposing the noxious gases pumped. The respective plasma sources 15 and 16 are according supplied by a high frequency generator 17 or 18 respectively, and incorporate high frequency coupling devices to transmit to the inner air space of inter-stage lines 10 and 11 the high frequency energy able to excite the gas molecules and produce the plasma.

Owing to the fact that the inter-stage lines have a relatively small cross-section, plasma sources 15 and 16 may be easily created via any means suitable for generating a plasma in such small spaces.

The system according to the invention thus creates, in inter-stage lines 10 and 11, a plasma suitable for deposing certain noxious gases issuing from a vacuum chamber connected to pump unit pumping inlet 3.

It can be seen that the plasma sources 15 and 16 are integrated within the pump unit. The high frequency generators 17 and 18 may be integrated within a housing 1, as their size may be reduced by the fact that the high frequency power necessary to generate plasma in the small air spaces of the inter-stage lines 10 and 11 is itself low.

Thanks to this integration of plasma sources 15 and 16 inside inter-stage lines 10 and 11, no additional conductance is added to the vacuum pump device so that the pumped gases move through the pump unit as easily as if there was no gas treatment device. The plasma itself generated in plasma sources 15 and 16 does not impede the movement of the gases.

Consequently, the pump unit's pumping capacity and speed are not affected by the presence of the gas treatment device according to the invention.

As the plasma can be created in the inter-stage lines over a reduced length and within a space with a smaller cross-section, thanks to the small size of the plasma source the high frequency generator 17 or 18 necessary has a lower power itself and is therefore much smaller.

By integrating several plasma sources 15 and 16 respectively inserted in several successive inter-stage lines between lower pressure first stages of the vacuum pump, the gas treatment is favored and this treatment takes place before any significant dilution in purge gases or neutralization gases. In the vacuum pump's low pressure stages, a high intensity light-emitting discharge with an optimized power is also obtained, for an effective decomposition of the noxious gases.

As is generally done with vacuum pumps intended to pump gases out of process chambers in the production of semiconductors, nitrogen or another purge gas is injected into inter-stage lines 10, 11, 12 and 13, via a purge circuit 19. The purpose of the purge gas is to prevent the depositing of noxious products on the pump's elements and also to prevent the gradual corrosion of these elements.

Owing to the fact that plasma sources 15 and 16 are preferably placed in the inter-stage lines of the pump's low pressure first stages, the plasma acts on the gases that have the lowest nitrogen content. This also means that the plasma is likely to create a lower proportion of noxious NOX type compounds.

Furthermore, purge circuit 19 may be used for the injecting of a neutralization gas such as oxygen or steam, to ensure, in the presence of plasma, a better decomposition of gases such as $CF_4$ through the reaction:

$$CF_4 + 2H_2O \rightarrow CO_2 + 4HF \qquad 1)$$

$$CF_4 + 2H_2O \rightarrow CO + 4HF + \tfrac{1}{2} \qquad 2)$$

To this end, the pumping system may comprise, according to the invention and as shown in the figure, a purge circuit 19 and a neutralization gas source 22 suitable for injecting a neutralization gas into purge circuit 19. Purge circuit 19 introduces the neutralization gas into the pump unit.

According to the invention, gas treatment may be carried out in multiplexed mode on the vacuum pump's various inter-stages, for example in inter-stage lines 10 and 11, or in inter-stage lines 10, 11 and 12, depending on the effectiveness of plasma creation and the different pressures in each part of the vacuum pump. The conditions in the vacuum pump may in fact vary depending on the process steps requiring gas pumping and the gas treatment may therefore be adjusted to the conditions reigning in the process chamber. The high frequency generators 17 and 18 are consequently driven by the control devices 23 such as a processor associated with memories and a recorded program, the program being suitable for adjusting the operating or shutting down of the high frequency generators 17 and 18 according to the optimum gas treatment conditions that must be complied with.

Alternatively, or in addition, the control devices 23 may also control the motor 14 to adjust the pump's rotation speed in order to optimize the internal pressures and the respective plasma parameters in inter-stage lines 10 and/or 11. The plasma-induced gas species conversion yield may in this way be increased.

Alternatively, or in addition, the control devices 23 may also adjust the plasma generation power delivered by the plasma sources according to the pump speed by controlling the high frequency generators 17 and 18. The plasma-induced gas species conversion yield may also be increased in this way.

Finally, it may be advantageous to provide real time control of gas treatment through optical spectrometric measuring of the plasma. To this end, a measuring device may be associated with the high frequency electrode of each plasma source 15 or 16. The measuring device may be an optical spectrometer 20 or 21, for example, connected to an optical fiber 24 or 25 to receive the light radiation emitted by the corresponding plasma source 15 or 16. The information gathered by the optical spectrometers 20 and 21 is sent to the control device 23, which may, in response, adjust the speed of the motor 14, the power of the high frequency generators 17 and 18 and the injecting of neutralization gas by the neutralization gas source 22. This would improve the controlling and optimizing of the gas reactions in the inter-stage lines still more.

Figure 2:
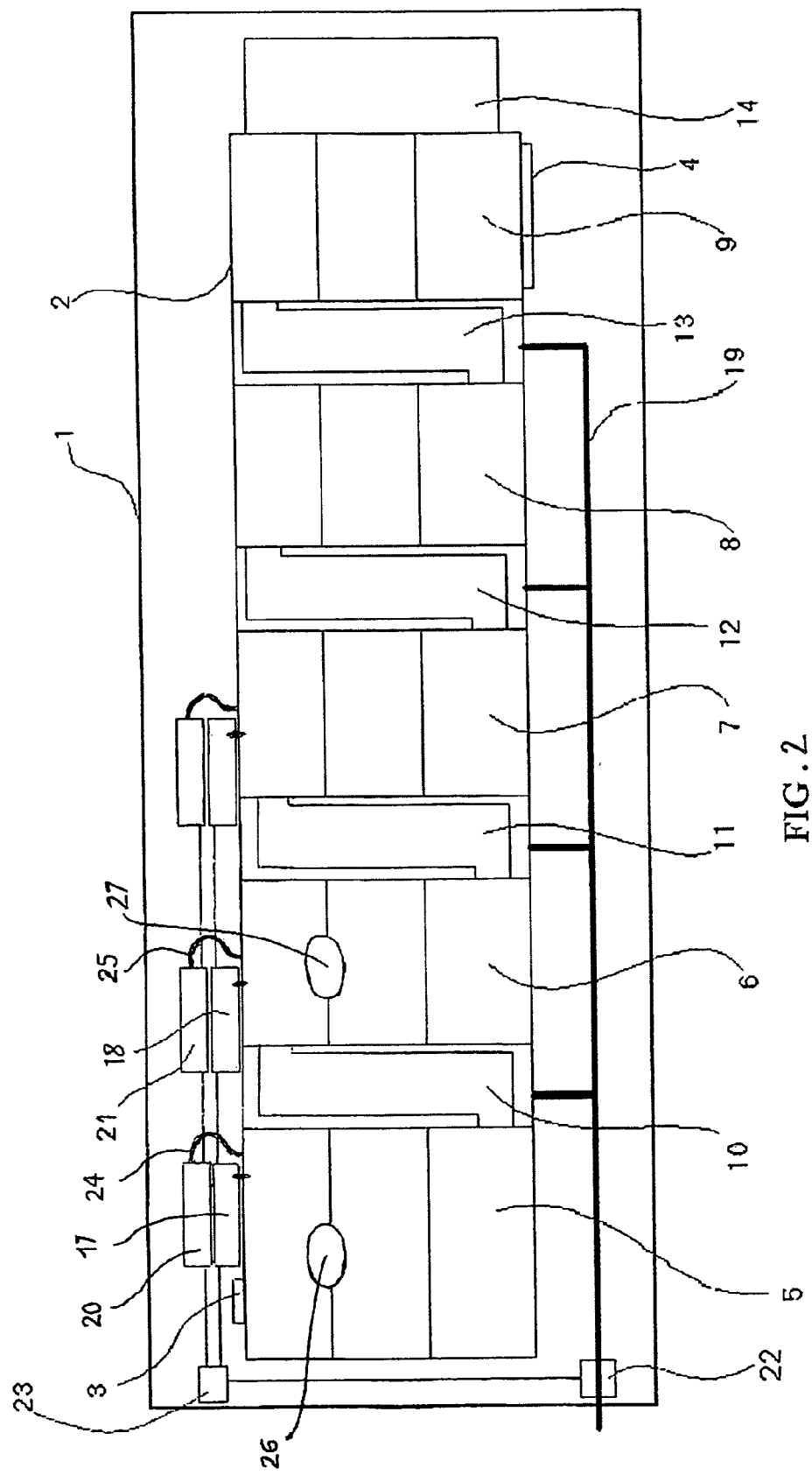
FIG. 2 shows a pumping system equipped with a gas treatment system according to the invention in which the plasma sources are located in the stages.

According to a second approach, the pumping system shown in FIG. 2 comprises, in a housing 1, a pump unit 2 with a vacuum pump casing in which there are multiple pumping stages 5, 6, 7, 8 and 9 between an inlet 3 and a pumping outlet 4.

The lower pressure stages 5 and 6 of pump unit 2 contain two respective plasma sources 26 and 27 suitable for generating, in the low pressure pumped gases contained in stages 5 and 6, a plasma able to decompose the low pressure pumped noxious gases contained in stages 5 and 6. The plasma sources 26 and 27 are accordingly supplied by a high frequency generator 17 or 18 respectively, and include high frequency coupling devices to transmit to the inner air spaces of stages 5 and 6, the high frequency energy able to excite the gas molecules and produce plasma.

Owing to the fact that stages 5 and 6 are relatively small, the plasma sources 26 and 27 can be easily created by any known means suitable for the generating of a plasma in such small spaces.

According to the invention, the system thus creates, in stages 5 and 6, a plasma suitable for decomposing certain noxious gases issuing from a vacuum chamber connected to the pumping inlet 3 of pump unit 2.

It can be seen that the plasma sources 26 and 27 are integrated within the vacuum pump casing of pump unit 2. The high frequency generators 17 and 18 may be integrated in housing 1, as their size may be reduced owing to the fact that the high frequency power necessary to generate plasma in the small air spaces of stages 5 and 6 is itself low.

Thanks to this integration of the plasma 26 and 27 inside stages 5 and 6, no additional conductance is added to the vacuum pump device, which means that the pumped gases move through pump unit 2 as easily as if there were no gas treatment device. The plasma itself generated by the plasma sources 26 and 27 does not impede the movement of the gases.

Consequently, according to the invention, the pump unit's pumping capacity and speed are not affected by the presence of the gas treatment device.

As the plasma can be created in the small air spaces in stages 5 and 6, the small size of the plasma source 26 or 27 means that the necessary high frequency generator 17 or 18 respectively has a reduced power itself and is much smaller.

By integrating several plasma sources 26 and 27 inserted respectively in successive low pressure first stages 5 and 6 of the vacuum pump, gas treatment is favored and this treatment takes place before any significant dilution in purge gases or neutralization gases. Furthermore, in the vacuum pump's low pressure stages 5 and 6, a high intensity light-emitting discharge with an optimized power is obtained, for an effective decomposition of the noxious gases.

Nitrogen or another neutralization gas may also be injected into the inter-stage lines 10, 11, 12 and 13 via a purge circuit 19 as described previously.

As the plasma sources 26 and 27 are preferably placed in the pump's low pressure first stages 5 and 6, the plasma acts on the gases that have the lowest nitrogen content. This also means that the plasma is likely to create a lower proportion of noxious NOX type compounds.

According to the invention, gas treatment may be carried out in multiplexed mode on the vacuum pump's various stages, for example in stage 5, or in stage 6, 7, 8 and/or 9, depending on the effectiveness of plasma creation and the different pressures in each part of the vacuum pump. The conditions in the vacuum pump may in fact vary depending on the process stages requiring gas pumping and the gas treatment can therefore be adjusted to the conditions reigning in the process chamber. The high frequency generators 17 are 18 accordingly controlled by the control devices 23 as described previously.

Alternatively, or in addition, the control devices 23 may also control the motor 14 to adjust the pump's rotation speed in order to optimize the internal pressures and the respective plasma parameters in stages 5 and/or 6.

Finally, it may be advantageous to provide real time control of gas treatment through optical spectrometric measuring of the plasma. Consequently, a measuring device, such as an optical spectrometer, may be associated with each plasma source 26 or 27 as described previously.

The invention thus allows the creating of gas pumping and treatment systems of a sufficiently small size to be placed directly in the ground close to the process chambers in semiconductor production facilities.

The invention applies not only to new pumping systems integrated in new equipment, but also to existing pumping systems, in which the pumped gas treatment device may be integrated through the replacing of the existing pumps.

The invention device allows the reducing of emissions of PFC type greenhouse gases, which are often used in semiconductor equipment for the dielectric etching and CVD depositing process cleaning stages.

The integration of plasma sources in the vacuum pump itself after the first compression stage allows the back-diffusion of gas towards the process chamber to be reduced.

The present invention is not limited to the approaches that are explicitly described; it includes all the different variants and generalizations that are within the scope of professionals in this field.

The invention claimed is:

1. Gas pumping and treatment system, comprising at least one pump unit with a vacuum pump casing equipped with multiple pumping stages and comprising at least one pumped gas treatment system, in which the pumped gas treatment system comprises at least one plasma source, located inside the vacuum pump casing of the pump unit, to generate a plasma that at least partially decomposes some of the gases passing through the pump unit.

2. Gas pumping and treatment system according to claim 1, in which the plasma source is located in a stage inside the vacuum pump casing of the pump unit.

3. Gas pumping and treatment system according to claim 2, in which stage containing the plasma source is a low pressure stage.

4. Gas pumping and treatment system according to claim 1, in which the plasma source is located in an inter-stage line inside the vacuum pump casing of the pump unit.

5. Gas pumping and treatment system according to claim 4, in which the inter-stage line connects two low pressure stages of the pump unit.

6. Gas pumping and treatment system according to claim 1, comprising several plasma sources respectively inserted into several successive inter-stage lines between stages of the pump unit.

7. Gas pumping and treatment system according to claim 1, comprising a purge circuit, and a neutralization gas source suitable for the injecting of a neutralization gas into the purge circuit to introduce said neutralization gas into the pump unit.

8. Gas pumping and treatment system according to claim 1, comprising the control devices that adjust the pump unit's rotation speed to optimize the internal pressures and respective plasma parameters in inter-stage line, in order to increase the rate of conversion of the gas species by the plasma.

9. Gas pumping and treatment system according to claim 1, comprising control devices that adjust the plasma generation power delivered by the plasma source according to the pumping speed, in order to increase the plasma-induced gas species conversion yield.

10. Gas pumping and treatment system according to claim 1, comprising at least one optical spectrometry plasma measuring device associated with at least one plasma source, which measures, monitors and optimizes the gas reactions in the inter-stage line, by acting on the speed of the pump unit, and/or on the power of the plasma source, and/or on the quantity of neutralization gas injected by the neutralization gas source into the purge circuit.

* * * * *